WITNESSES:
Wm. C. Groome
C. L. Menzemer

INVENTOR
John W. Faust, Jr.
BY
Frederick Shapoe
ATTORNEY

Nov. 21, 1961 J. W. FAUST, JR 3,009,841

PREPARATION OF SEMICONDUCTOR DEVICES
HAVING UNIFORM JUNCTIONS

Filed March 6, 1959 2 Sheets-Sheet 2

United States Patent Office 3,009,841

Patented Nov. 21, 1961

3,009,841

PREPARATION OF SEMICONDUCTOR DEVICES HAVING UNIFORM JUNCTIONS

John W. Faust, Jr., Forest Hills, Pa., assignor to Westinghouse Electric Corporation, East Pittsburgh, Pa., a corporation of Pennsylvania Filed Mar. 6, 1959, Ser. No. 797,651
8 Claims. (Cl. 148—1.5)

This invention relates to an improved process for the preparation of a semiconductor transition region between two materials of opposite type semiconductivity.

Currently in the preparation of p-n junctions, a surface of a wafer of a semiconductive material is chemically polished to produce a smooth surface. The doping impurity is then applied to the wafer by diffusion or alloying. Devices prepared in this manner are often characterized low breakdown voltages and surface leakage.

An object of the present invention is to provide an improved process for the preparation of a uniform junction in a semiconductor device between two materials of opposite type semiconductivity.

Another object of the present invention is to provide a semiconductor device capable of operating at an increased voltage with a substantially reduced surface leakage.

Other objects of the present invention will, in part, be obvious and will, in part, appear hereinafter.

For a better understanding of the nature and objects of the invention, reference should be had to the following detailed description and drawing in which.

In accordance with the present invention and attainment of the foregoing objects, there is provided an improvement in the process of preparing a junction between semiconductive materials of opposite type semiconductivity comprising the steps of (1) abrading at least one surface of a wafer of a semiconductive material having a first type of semiconductivity, to produce a region within said wafer having a controlled uniform depth of damage with a high density of dislocations to a predetermined depth substantially less than the thickness of the wafer, (2) applying to the abraded surface a doping material which will pass rapidly and completely through the disturbed region into contact with the undisturbed portion of the wafer, whereby, a relatively uniformly doped zone of the semiconductive material having a second type semiconductivity is formed in the undisturbed and (3) thereafter removing the disturbed region by etching. The resulting wafer will exhibit a highly uniformly thick doped region of the second type of semiconductivity, and may be fabricated into a semiconductor device.

Figure 1:
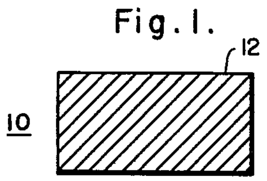
FIG. 1 is a view in cross-section of a wafer of semiconductive material suitable for use in accordance with this invention.

More specifically and with reference to FIG. 1, there is illustrated a wafer 10 of a suitable semiconductive material, for example, silicon, germanium, silicon carbide and Group III and V intermetallic compounds such as indium-arsenide, of a first type of semiconductivity.

In accordance with the teaching of this invention, surface 12 of the wafer 10 is abraded. Examples of abrading methods which may be employed include; (1) dry abrading in a manner similar to sanding of wood, (2) lapping by hand, machine or cavitation, (3) saw cutting, (4) sand blasting and the like. While any of the abrading methods known to the art may be used, lapping is the preferred method.

Figure 2:
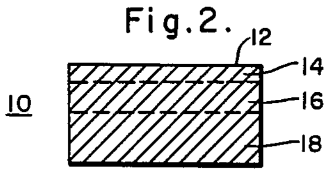
FIG. 2 is a view in cross-section of a wafer of a semiconductive material suitable for use in accordance with this invention.

The abraded surface consists of a very high, uniform density of mechanically produced dislocations at the surface 12 extending into the semiconductor wafer 10 a distance characterized by the known properties of the abrasive, the method of abrading employed, and the material being abraded. FIG. 2 illustrates the wafer 10 after it has been abraded in accordance with this invention. The wafer is comprised of an abraded surface 12, a region 14 in which the crystal structure has been greatly disturbed, a region 16 in which the crystal structure has been partially disturbed, and an undisturbed region 18.

Ideally, there is a minimum depth of damage associated with any given abrasive treatment for each material. The factors that determine this minimum damage can be divided into two groups (1) those associated with the abrasive and (2) those associated with the material being abraded.

Examples of suitable abrasives for use in accordance with this invention include alumina ($Al_2O_3$), silicon carbide (SiC) and diamond. Alumina is preferred because the particles are roughly spherical and therefore present a uniform particle size regardless whether rotation is about the longitudinal or transverse axis of the particle during the abrading.

Table I below shows the effect of various abrasive materials upon a silicon (100) surface. The abrasives used had an average particle size of 600 mesh.

TABLE I

| Abrasive: | Depth of damage (microns) |
|---|---|
| Alumina | 3–4 |
| Silicon carbide | 7–8 |
| Diamond | 3–4 |

Figure 3:
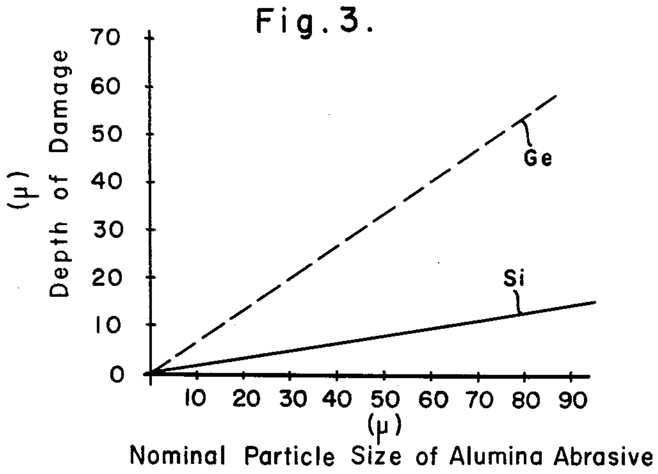
FIG. 3 is a graphical representation of the relationship between particle size of the abrasive and depth of an abraded layer in a semiconductive wafer

In general, the depth of the abrasion produced increases proportionally with an increase in the particle size of the abrasive. For silicon and germanium, the depth of damage is a linear function of the particle size of the abrasive employed. The relationship is illustrated in FIG. 3.

When an abrasive material is used too long, the abrasive becomes contaminated with a relatively large quantity of the material being abraded with the result that the abraded layer may be more deeply and unevenly damaged. It is desirable to employ an abrasive in which all the particles are of a diameter close to the average diameter of all the particles. A few excessively large particles will produce highly erratic depth of damage.

The amount of abrading achieved on any given surface is also dependent upon the method of abrading used. As mentioned above, the several methods, dry abrading, lapping, cutting with a saw and said blasting, are all satisfactory under properly controlled conditions in accordance with this invention.

Lapping is very similar to dry abrading except, the abrasive material is used in a liquid medium. The liquid medium may also be agitated by ultrasonic means during the abrading. Suitable liquid media include water, hydrogen peroxide-tartaric acid mixtures and hydrogen peroxide.

Numerous cutting saws are available commercially, however, the best results have been achieved employing diamond or silicon carbide saw blades.

Table II below illustrates the effect of the various abrading means upon silicon and germanium.

TABLE II

| Abrasive | Method of Abrading | Material | Depth of Damage (μ) |
|---|---|---|---|
| 600 Mesh SiC | Lap | (100) Ge | 17-18 |
| 600 Mesh SiC | Ultrasonically Agitated Suspension. | (100) Ge | 1-2 |
| Diamond | Saw Cut | (100) Ge | 50-75 |
| 220 Mesh $Al_2O_3$ | Lap | (111) Si | 11 |
| 220 Mesh Diamond | Wheel | (111) Si | 15 |

The depth the abraded layer produced in a particular material varies with the crystal orientation of the surface of the material being abraded. Table III illustrates the variation in the depth of damage due to different surface orientation.

TABLE III

| Abrasive | Method of Abrading | Material | Depth of Damage (μ) | | |
|---|---|---|---|---|---|
| | | | (111) | (110) | (100) |
| 3200 Mesh $Al_2O_3$ | Lap | Ge | 4-5 (111) | 3 (110) | 5-7 (100) |
| 800 Mesh $Al_2O_3$ | Lap | Si | 2-2.5 | 1.5 | 2-4 |

It is believed that the segment comprising region 16 is attributable to plastic deformation of the material being abraded. The depth of this region will be proportional to the specific heat of the material being abraded and to the amount of heat generated in the abrasive process that is not dissipated to the ambient. The effect of local heating upon a germanium (100) surface during abrasion is set forth in Table IV below.

TABLE IV

| Abrading Material | Method | Temperature, ° C. | Average Depth of Damage |
|---|---|---|---|
| 600 Mesh $Al_2O_3$ | Lap | 25 | 21 |
| 600 Mesh $Al_2O_3$ | Lap | 100 | 28 |

In the practice of this invention, the best results have been achieved when the semiconductor wafer is damaged to a total depth of from 1 micron to 5 microns when comprised of silicon, and from 5 microns to 20 microns when comprised of germanium. The abrading material, method of abrading and the conditions under which the abrading is carried out are selected in accordance with the above factors which are selected on the basis of convenience, to achieve a damaged depth within this range. If desired, damage to other depths may be produced with satisfactory results.

After abrasion, a p-n junction (or n-p junction) may be fabricated by either (1) the diffusion of a suitable doping material or (2) the direct alloying of a doping pellet through the damaged layers 14 and 16 to the sound region 18 of the wafer 10. Upon continuation of heating, the doping will penetrate uniformly into the sound region to depth 20 as shown in FIG. 4.

Examples of suitable doping material which may be diffused or alloyed to the wafer 10 separately or in combination in accordance with the teachings of this invention include; p-type materials such as aluminum, gallium, indium and the like; and n-type materials such as phosphorous, antimony, arsenic and the like.

As the doping material, introduced by either diffusion or alloying enters the disturbed layers 14 and 16, it rapidly diffuses down through the mechanically produced dislocations. Since there is a very high, yet uniform density of these dislocations, diffusion quickly causes the doping impurity to be come uniformly diffused throughout the area to which it is applied thereby affording a diffusion front having a uniform density of impurity at the bottom of the disturbed layer 16 in spite of any unevenness on the surface 12 or in zone 14 that could impede diffusion. Furthermore, such a uniform diffusion front insures a constant supply of doping impurity atoms at its interface.

Figure 4:
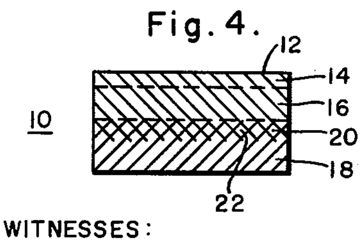
FIGS. 4 and 5 are views in cross-section of a wafer of a semiconductive material in one stage of the process of this invention.

With reference to FIG. 4, there is illustrated the wafer 10 after the diffusion of the doping material thereinto. The wafer 10 is now comprised of the abraded surface 12, disturbed regions 14 and 16, and the sound or undamaged region 18. A semiconductor transition region 20 forming a p-n junction 22 has been established in the sound region 18.

Figure 5:
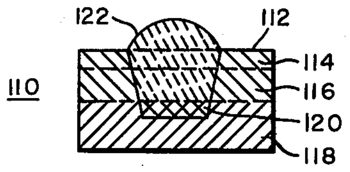

When the p-n junction is established within an abraded wafer by alloying with a doping pellet, layer or applied material, the abrasion on the surface of the wafer prevents the uncontrolled spreading of the doping material along the surface thereby ensuring a deep and uniform penetration of the doping material through the wafer to the sound region. With reference to FIG. 5, there is illustrated a wafer 110 of a suitable semiconductive material doped with a first impurity. The wafer has been abraded in accordance with the teachings of this invention, whereby, there has been produced an abraded surface 112, a region 114 in which the crystal structure has been greatly disturbed, a region 116 in which the crystal structure has been partially disturbed and an undisturbed region 118. A doping pellet 122, comprised of any suitable doping material, was disposed upon surface 112 and alloyed to the wafer by melting it by any of the methods known in the art. The abraded surface 112 appears to cause the molten pellet material to stay in place and prevents the doping material 122 from spreading in an uncontrolled manner along the surface, thereby, ensuring that a sufficient quantity of the doping material would rapidly and uniformly penetrate through regions 114 and 116 to region 118 and that a uniform semiconductor transition region 120 would be formed slowly in region 118.

Figure 6:
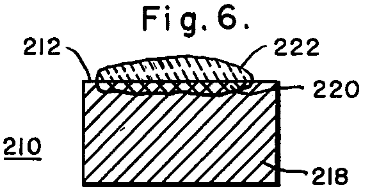
Fig. 6. Prior Art
FIG. 6 is a view in cross-section of a wafer of a semiconductive material in one stage of the prior art process.

With reference to FIG. 6, there is illustrated a wafer 210, of a suitable semiconductive material, to which a suitable doping material 222 has been alloyed. Surface 212 of wafer 210 had been chemically polished, in accordance with the teaching of the prior art, and was substantially a smooth flat surface before alloying. Due to the smoothness of surface 212, the doping material 222 spread in an uncontrolled manner along surface 212 to form an irregular area. The quantity of doping material that penetrated the surface 212 at any point was a variable, and a semiconductor transition region 220 that was formed was shallow and of a variable and irregular depth. Therefore, the wafer 210, when fabricated into a semiconductor device, does not have as good characteristics as does a device fabricated from wafer 110.

One of the principal advantages of the abraded surface technique taught by this invention, is not so much that the same size alloy dot will penetrate deeper into the lapped surface wafer to a higher resistivity region to give a higher PIV, but that by following the teachings of this invention it is possible to control the spreading of the alloy dot on the lapped surface wafer. This control of area of doping can be exerted on each device produced, thereby making possible the production of devices having the same I–V characteristics.

Figure 7:
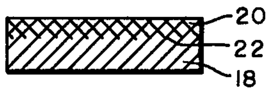
FIGS. 7 and 8 are views in cross-section of wafers of a semiconductive material in various stages of preparation in accordance with the teachings of this invention.

With reference again to FIG. 4, and to FIG. 7, after the formation of the p-n junction 22, the abraded surface 12 and disturbed regions 14 and 16 of wafer 10 are removed by etching. While any etchant, chemical or electrolytic, can be employed, the character of the abraded surface 12 and regions 14 and 16, and the fact that there is more material to be removed than in prior art practice makes possible the use of preferential etches that are generally more reliable and easier to control than the non-preferential chemical polishes required for etching prior art devices. The wafer 10, after the removal of surface 12 and regions 14 and 16 is shown in FIG. 7.

The choice of a suitable etchant is dependent upon the material to be etched and the amount of material to be removed. Examples of suitable etchants include; for silicon: etchants comprising (1) 10 parts, by weight, sodium hydroxide and 90 parts, by weight, distilled water, and (2) 15 parts, by volume, acetic acid, 25 parts, by volume, nitric acid and 15 parts, by volume, hydrofluoric acid; for germanium: etchants comprising 1 part, by volume, hydrofluoric acid, and 4 parts, by volume, water. As pointed out above, practicing the teachings of this invention permits the employment of any suitable etchant known in the art, whereas, before only a chemical polish or electrolytic etch was deemed suitable.

Figure 8:
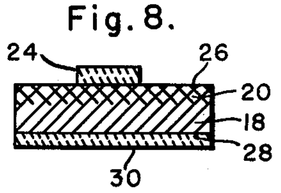

With reference to FIG. 8, after the surface 12 and regions 14 and 16 have been removed by etching, a counterelectrode contact 24 is soldered or brazed to surface 26 and a base contact 28 is soldered or brazed to the lower surface 30 of the wafer 10. The contacts 24 and 28 may be comprised of any suitable material, for example, molybdenum, tantalum, tungsten and the like. Examples of suitable solders for joining contact 24 to surface 26 include tin-lead solders and silver-base brazing alloys for example, 95% silver–5% lead, 90% silver–6% lead–2% tin–2% antimony for applying to n-type layers.

The following examples are illustrative of the practice of this invention and set forth the advantages derived from practicing the teachings of this invention:

*Example I*

Two identical wafers were cut from adjacent areas of the same n-type semiconductivity silicon crystal having a resistivity of 8 ohm-cm.

The (111) surface of the first wafer was hand lapped with alumina having an average particle size of 800 microns to provide a total depth of damage of 2 microns.

The (111) surface of the second surface was etched with an etchant comprised of 15 parts, by volume, acetic acid, 25 parts, by volume, nitric acid and 15 parts, by volume, hydrofluoric acid.

The first and second wafers were then meshed to expose only the upper surface of each, and then simultaneously doped by the diffusion of gallium vapor thereinto for 4 hours at 1200° C.

The abraded doped silicon wafer was etched in a preferential etch comprising 10 parts, by weight, sodium hydroxide and 90 parts by weight, water, to remove all of the damaged layer.

The two wafers were then fabricated into diodes by soldering contacts thereto, and the current-voltage characteristics of the two diodes measured.

Figure 9:
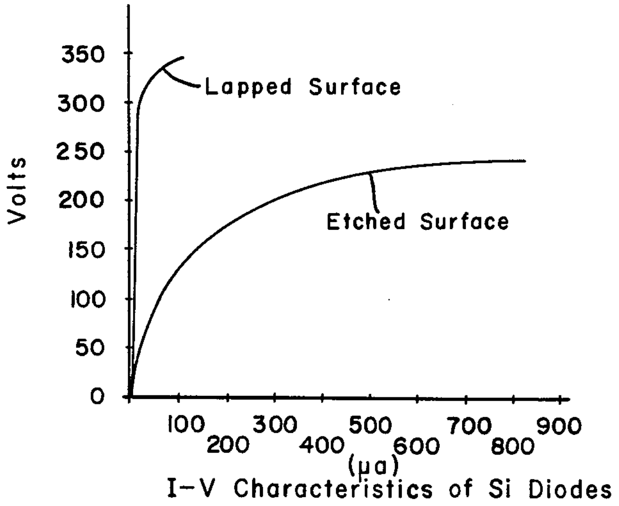
FIGS. 9 to 11 are graphs comparing the I–U characteristics of semiconductor devices prepared in accordance with this invention and devices prepared in accordance with the prior art.

FIG. 9 is a plot of the reverse I–V characteristics of the two devices. From FIG. 9 it can be readily seen that the diode prepared from the lapped surface wafer can withstand or operate under a markedly higher voltage with less leakage than the diode prepared from the etched surface wafer.

*Example II*

Two identical wafers were cut from adjacent areas of the same p-type semiconductivity germanium crystal.

The (111) surface of the first wafer was hand lapped with alumina having an average particle size of 600 microns to provide a total depth of damage of 15 microns.

The (111) surface of the second wafer was etched with an etchant comprised of 15 parts, by volume, acetic acid, 25 parts, by volume, nitric acid and 15 parts, by volume, hydrofluoric acid.

The first and second wafers were then doped simultaneously by the diffusion thereinto of arsenic vapor for four hours at 800° C.

The abraded doped germanium wafer was etched with a preferential etch comprising 2 parts hydrofluoric acid, 1 part nitric acid and 2 parts of a 5% by weight silver nitrate solution, to remove all the damaged layer.

The two wafers were then fabricated into diodes by soldering contacts thereto and the current-voltage characteristics of the two diodes measured.

Figure 10:
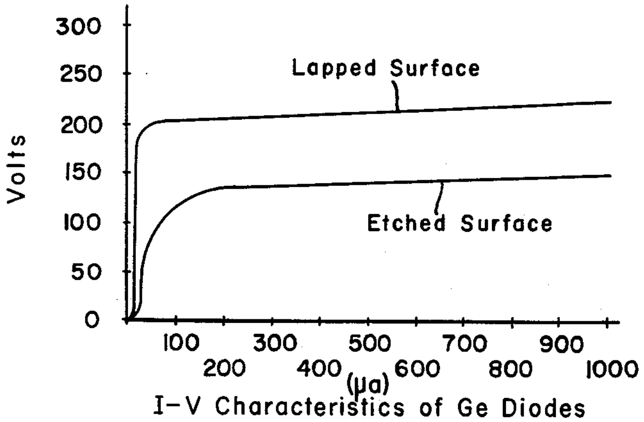

FIG. 10 is a plot of the reverse I–V characteristics of the two devices. From FIG. 10 it can be readily seen that the diode prepared from the lapped surface wafer can withstand and be operated at a higher voltage with less leakage than the diode prepared from the etched surface wafer.

*Example III*

Two identical wafers were cut from adjacent areas of the same n-type semiconductivity germanium wafer having a resistivity of 30 ohm-cm.

The (111) surface of the first wafer was hand lapped with alundum having an average particle size of 800 microns to provide a total depth of damage of 20 microns.

The (111) surface of the second wafer was etched with an etch comprised of 15 parts, by volume, acetic acid, 25 parts, by volume, nitric acid and 15 parts, by volume, hydrofluoric acid.

The first and second wafers were then simultaneously diffused with arsenic vapor for two hours at 800° C. This diffusion resulted in an n+ type layer about both the n-type wafers.

An indium sphere having a diameter of 7 mils was then alloyed by heating above melting temperature of indium to each wafer through the n+ layer at the damaged and polished surfaces, respectively. During the alloying and diffusion, the indium spread over the etched surface to cover a greater and rather irregular area than that covered on the lapped surface wafer. A deeper and more uniform penetration was realized in the lapped wafer than in the etched wafer.

The abraded doped germanium wafer was etched with an etch comprising 1 part, by volume, hydrofluoric acid and 4 parts, by volume, water to remove all of the damaged layer.

The two wafers were fabricated into diodes by soldering contacts thereto and the current-voltage characteristics of each of the diodes was measured.

Figure 11:
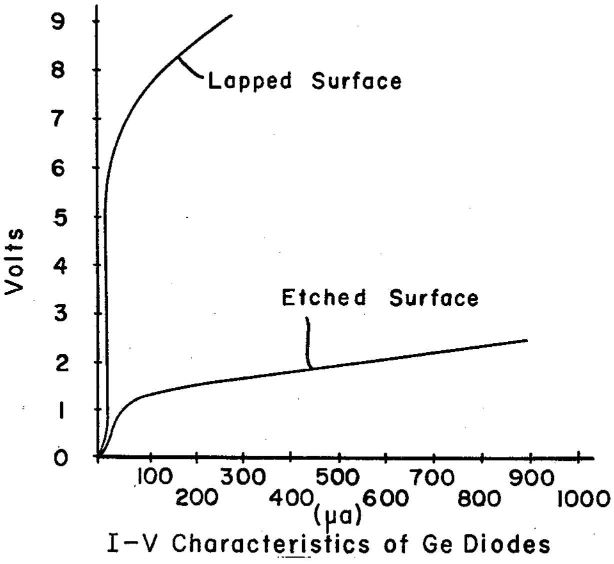

FIG. 11 is a plot of the reverse I–V characteristics of the two devices. From FIG. 11, it can be readily seen that the diode prepared from the wafer with the lapped surface can withstand and operate at a higher voltage with less leakage than the diode prepared from the etched surface wafer.

While this invention has been described in terms of preparing a single p-n junction and the fabrication of a wafer containing this junction into a diode, it will be understood that the teachings of this invention are equally applicable to the preparation of two or more p-n junctions in a wafer and to fabrication of such wafers into semiconductor devices such as transistors, phototransistors and the like. When it is desired to form two p-n junctions within a wafer, two opposite surfaces of the wafer are abraded and the procedure described above followed to prepare each p-n junction.

While this invention has been described with reference to particular embodiments and examples, it will be understood that modifications, substitution and the like may be made without departing from its scope.

I claim as my invention:

1. In the process for providing in a semiconductive material a junction between different types of semiconductivity, the steps comprising, (1) mechanically abrading at least one surface of a wafer of the semiconductive material having a first type of semiconductivity, to produce at the abraded surface an extending into the wafer therefrom, a region having a controlled uniform depth of damage and disturbance with a high density of dislocations, the depth of said region being substantially less than the thickness of the wafer, (2) passing a doping material completely through the disturbed region and allowing it to contact and diffuse into the undisturbed portion of the wafer below said disturbed region, whereby a zone of a second type semiconductivity is formed within the undisturbed portion of the wafer, and (3) thereafter removing all of the disturbed region of the wafer by etching.

2. In the process for preparing a p-n junction between semiconductive materials the step comprising, (1) mechanically abrading a surface of a wafer of a semiconductive material of a first type semiconductivity selected from the group consisting of silicon and germanium, to a preselected depth within the range of from 1 micron to 20 microns to produce at the abraded surface and extending into the wafer therefrom, a region therein having a controlled uniform depth of damage and disturbance with a high density of dislocations, the depth of said region being substantially less than the thickness of the wafer, (2) applying to the abraded surface a doping material and passing the doping material completely through the disturbed region and allowing it to contact and diffuse into the undisturbed portion of the wafer, whereby, a zone of a second type semiconductivity is formed within the undisturbed portion of the wafter, and (3) thereafter removing all of the disturbed region of the wafer by etching.

3. In the process for preparing a p-n junction between semiconductive materials the steps comprising, (1) mechanically abrading a surface of a wafer of a semiconductive material of a first type semiconductivity selected from the group consisting of silicon and germanium, to a preselected depth within the range of 1 micron to 20 microns to produce at the abraded surface and extending into the wafer therefrom, a region therein having a controlled uniform depth of damage with a high density of dislocations, the depth of said region being substantially less than the thickness of the wafer, (2) applying vapors of a doping material to the abraded surface and heating to diffuse the doping material completely through the disturbed region to contact with the undisturbed portion of the wafer and diffuses thereinto, whereby, a zone of a semiconductive material of a second type semiconductivity is formed within the undisturbed portion of the wafer, and (3) thereafter removing all of the disturbed region of the wafer by etching.

4. In the process for preparing a p-n junction between semiconductive materials the steps comprising, (1) mechanically abrading a surface of a wafer of a semiconductive material of a first type semiconductivity selected from the group consisting of silicon and germanium, to a preselected depth within the range of 1 micron to 20 microns to produce at the abraded surface and extending into the wafer therefrom, a region therein having a controlled uniform depth of damage with a high density of dislocations, the depth of said region being substantially less than the thickness of the wafer, (2) applying a quantity of solid doping material to selected portions of the abraded surface and heating the doping material to produce a melted body at the selected portions which penetrates completely through the disturbed region by alloying and comes into contact with the undisturbed portion of the wafer and diffuses into it, whereby, a zone of a semiconductive material of a second type semiconductivity is formed, the disturbed region enabling the penetration and alloying to conform to the selected portions whereby the zone of second type of semiconductivity is controlled to correspond to the selected portions and is of a highly uniform depth, and (3) thereafter removing all of the disturbed region of the wafer by etching.

5. In the process for preparing a p-n junction between semiconductive materials the steps comprising, (1) mechanically abrading a surface of a silicon wafer to a depth of from 1 to 5 microns to produce within the wafer a region having a controlled depth of damage with a high density of dislocations, (2) passing a doping material completely through the disturbed region and allowing it to contact the undisturbed portion of the wafer, whereby, a zone of a semiconductive material of a second type semiconductivity is formed within the undisturbed portion of the wafer, and (3) thereafter removing all of the disturbed region of the wafer by etching.

6. A process for preparing a junction between semiconductive materials of opposite type semiconductivity comprising, (1) mechanically abrading a surface of a germanium wafer to a depth of from 5 to 20 microns to produce within the wafer a region having a controlled depth of damage with a high density of dislocations, the region extending from the mechanically abraded surface into the wafer, (2) passing a doping material completely through the disturbed region and allowing it to contact the undisturbed portion of the wafer, whereby, a zone of a semiconductive material of a second type semiconductivity is formed within the undisturbed portion of the wafer, and (3) thereafter removing all of the disturbed region of the wafer by etching.

7. In a process for producing a semiconductor device in which at least one p-n junction the steps comprising (1) mechanically abrading at least one surface of a wafer of a semiconductive material, having a first type of semiconductivity, to produce a region, within said wafer, having a controlled uniform depth of damage with a high density of dislocations, the depth of said region being substantially less than the thickness of the wafer, (2) passing a doping material completely through the disturbed region and allowing it to contact the undisturbed portion of the wafer, whereby, a zone of a semiconductive material of a second type semiconductivity is formed, (3) removing all of the disturbed region of the wafer by etching, and (4) applying an ohmic contact to the etched surface and to another portion of the wafer having an opposite type of semiconductivity.

8. In a process for producing a semiconductor device in which at least one p-n junction the steps comprising (1) mechanically abrading a surface of a wafer of a semiconductive material of a first type semiconductivity selected from the group consisting of silicon and germanium, to a preselected depth within the range of 1 micron to 20 microns to produce a region therein having a controlled uniform depth of damage with a high density of dislocations, the depth of said region being substantially less than the thickness of the wafer, (2) applying an alloying pellet to a surface of the disturbed region and melting it so as to pass the doping material completely through the disturbed region and allowing it to contact the undisturbed portion of the wafer, whereby, a zone of a semiconductive material of a second type semiconductivity is formed, and (3) removing the disturbed region of the wafer by etching, and applying an ohmic contact to the alloy pellet and a second ohmic contact to another portion of the wafer having an opposite type of semiconductivity.

References Cited in the file of this patent

UNITED STATES PATENTS

| | | |
|---|---|---|
| 2,846,346 | Bradley | Aug. 5, 1958 |
| 2,854,365 | Matare | Sept. 30, 1958 |
| 2,854,366 | Wannlund et al. | Sept. 30, 1958 |

OTHER REFERENCES

"The Migration of Solute Atoms to Dislocation Arrays," Bilby, Abstract #1162, page 346, Semiconductor Abstracts, vol. 4, 1956.